United States Patent [19]

Kovacs et al.

[11] Patent Number: 4,945,024
[45] Date of Patent: Jul. 31, 1990

[54] METHOD FOR IMPROVING COLOR BALANCE IN IMAGING SYSTEMS EMPLOYING PHOTOSENSITIVE MICROCAPSULES

[75] Inventors: Kerry Kovacs, Centerville; Amy Burkholder, Kettering, both of Ohio

[73] Assignee: The Mead Corporation, Dayton, Ohio

[21] Appl. No.: 269,528

[22] Filed: Nov. 10, 1988

[51] Int. Cl.$^5$ .......................... G03C 7/00; G03C 1/68
[52] U.S. Cl. ..................................... 430/138; 430/394
[58] Field of Search ..................... 430/138, 235, 394

[56] References Cited

U.S. PATENT DOCUMENTS

| | | | |
|---|---|---|---|
| 4,482,624 | 11/1984 | Arney et al. | 430/138 |
| 4,576,891 | 3/1986 | Adair et al. | 430/138 |
| 4,587,194 | 5/1986 | Adair et al. | 430/138 |
| 4,772,530 | 9/1988 | Gottschalk et al. | 430/138 |
| 4,840,866 | 6/1989 | Kovacs et al. | 430/138 |
| 4,842,976 | 6/1989 | Sanders et al. | 430/235 |

Primary Examiner—Richard L. Schilling
Attorney, Agent, or Firm—Thompson, Hine and Flory

[57] ABSTRACT

A process for forming full color images using a photosensitive material which includes a support having a layer of photosensitive microcapsules on the surface thereof, said photosensitive microcapsules including a first, a second and a third set of microcapsules uniformly distributed on said surface; said first set of microcapsules contains a cyan image-forming agent and a first photohardenable composition sensitive in a first wavelength band, said second set of microcapsules containing a magenta image-forming agent and a second photohardenable composition sensitive in a second wavelength band, and said third set of microcapsules containing a yellow image-forming agent and a third photohardenable composition sensitive in a third wavelength band; said process comprising the steps of:

uniformly exposing said photosensitive material to radiation within at least one of said first, second, and third wavelength bands in an amount sufficient to sequester oxygen present in said microcapsules and thereby adjust the gamma of at least one of said first, second and third sets of microcapsules such that it more closely approximates the gamma of the other of said microcapsules;

image-wise exposing said photosensitive material to radiation within said first, second and third wavelength bands; and subjecting said microcapsules to a uniform rupturing force to cause said microcapsules to rupture and release image-wise said cyan, magenta and yellow image-forming agents.

12 Claims, 2 Drawing Sheets

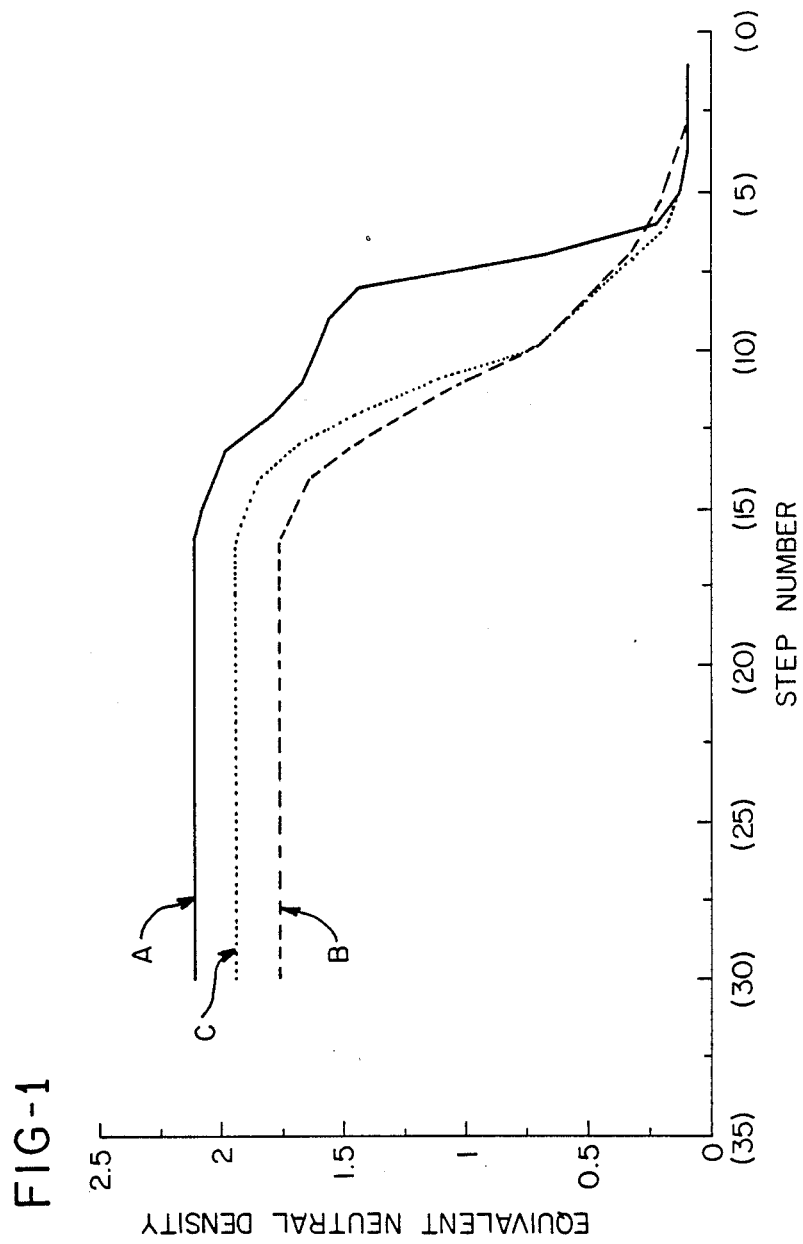

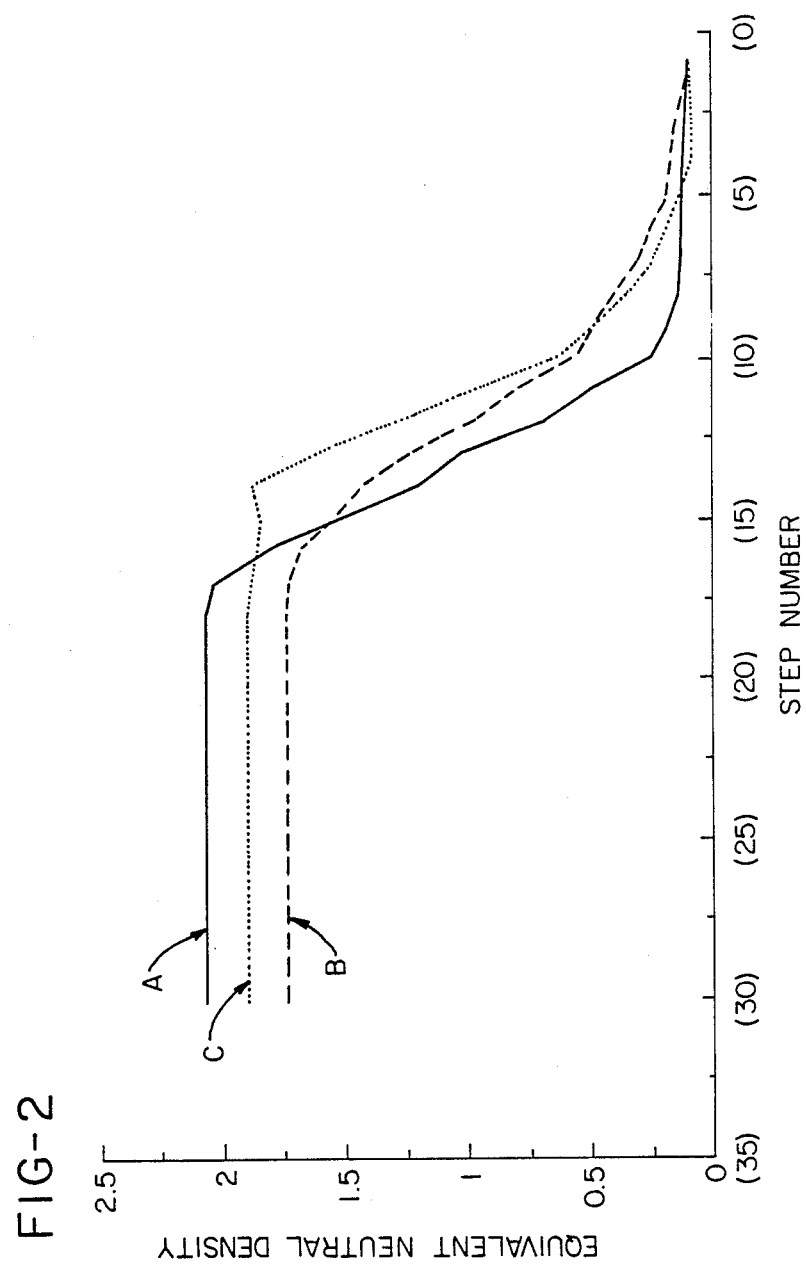

METHOD FOR IMPROVING COLOR BALANCE IN IMAGING SYSTEMS EMPLOYING PHOTOSENSITIVE MICROCAPSULES

BACKGROUND OF THE PRESENT INVENTION

The present invention relates to a method for improving color balance in photosensitive materials employing microencapsulated photosensitive compositions.

U.S. Pat. No. 4,482,624 to Arney et al. discloses a method for improving the sensitivity of photosensitive materials employing microencapsulated photosensitive compositions by conducting a uniform pre-exposure or co-exposure which reacts oxygen present in the microcapsules and converts it into a non-inhibiting form. It is known that oxygen inhibits free radical polymerization and that by chemically or physically eliminating oxygen present in the microcapsules, the speed of the microcapsules can be improved. It is also disclosed in U.S. Pat. No. 4,482,624, that de-oxygenating pre-exposure and co-exposure can be used to control gamma.

SUMMARY OF THE INVENTION

The teachings of U.S. Pat. No. 4,482,624 address systems employing microencapsulated photohardenable compositions in general. They do not address the use of deoxygenating pre-exposure or co-exposure as a means to achieving color balance in full color imaging systems.

In full color imaging systems employing microcapsules, three photohardenable compositions are used which are selectively sensitive in three wavelength bands. Those three wavelength bands can be three bands in the ultraviolet or blue region as disclosed in U.S. Pat. No. 4,576,891 but they are preferably red, green and blue light as disclosed in allowed U.S. Pat. Nos. 4,772,530 and 4,772,541.

Regardless of whether the microcapsules are sensitive to ultraviolet radiation or visible light, due to the different photohardenable compositions which are used in each of the three wavelength bands, the microcapsules exhibit different H&D characteristics and, more specifically, different gamma. As a result of these differences, the color balance achieved in the image may be poor. Color shades and hues may be produced which are not faithful reproductions of the original. One solution to this problem would be to design microcapsules having H&D characteristics which closely approximate each other by modifying the photohardenable compositions to achieve this result. This is difficult and it greatly restricts ones ability to make later modifications of the composition. In accordance with the present invention, the H&D characteristics of the microcapsules in a full color material are modified to control color balance through the use of a deoxygenating pre-exposure or co-exposure.

The present invention provides a process for forming full color images using a photosensitive material which includes a support having a layer of photosensitive microcapsules on the surface thereof, said photosensitive microcapsules including a first, a second and a third set of microcapsules uniformly distributed on said surface; said first set of microcapsules containing a cyan image-forming agent and a first photohardenable composition sensitive in a first wavelength band, said second set of microcapsules containing a magenta image-forming agent and a second photohardenable composition sensitive in a second wavelength band, and said third set of microcapsules containing a yellow image-forming agent and a third photohardenable composition sensitive in a third wavelength band; said process comprising the steps of:

uniformly exposing said photosensitive material to radiation within at least one of said first, second, and third wavelength bands in an amount sufficient to sequester oxygen present in said microcapsules and thereby adjust the gamma of at least one of said first, second and third sets of microcapsules such that it more closely approximates the gamma of at least one other of said microcapsules;

image-wise exposing said photosensitive material to radiation within said first, second and third wavelength bands; and subjecting said microcapsules to a uniform rupturing force to cause said microcapsules to rupture and release image-wise said cyan, magenta and yellow imageforming agents.

Detailed Description of the Invention

FIG. 1 illustrates the H&D curves for a full color, visible light-sensitive material employing microencapsulated photohardenable compositions. Curve A is a H&D curve for a green-sensitive microcapsule, curve B is a H&D curve for a red-sensitive microcapsule and curve C is a H&D curve for a blue-sensitive microcapsule. Because gamma for curve A is substantially higher than the gamma of curves B and C, and because the green-sensitive microcapsules are slower than the red or blue-sensitive microcapsules an imaging sheet employing these microcapsules will not provide optimum color balance unless some adjustment is made in processing the sheet to adjust for the difference in gamma. In accordance with the present invention, the photosensitive material can be pre-exposed or co-exposed through green-filter to alter the gamma of curve A as shown in FIG. 2 such that it more closely approximates the gamma of curves B and C. The deoxygenating pre-exposure or co-exposure has the effect of softening the shoulder of curve A without affecting the toe and thereby reduces gamma.

The amount of exposure used to improve color balance must be controlled such that it is sufficient to sequester oxygen present in the microcapsules and thereby control gamma but is not sufficient to advance substantially the imaging chemistry. Typically, pre-exposures or co-exposures range from up to about 10% of the intensity of the image-wise exposure.

Photosensitive materials useful in the present invention have previously been described in commonly assigned U.S. Pat. Nos. 4,399,209; 4,440,846; 4,562,137; 4,772,530 and 4,772,541.

The preferred photohardenable compositions are free radical addition polymerizable compositions such as compositions containing an ethylenically unsaturated compound such as TMPTA (trimethylolpropane triacrylate).

The preferred photoinitiators for use in the present invention are cyanine dye borates which are described in detail in allowed U.S. Pat. Nos. 4,772,530 and 4,772,541. Presently dye-borates are used for sensitivity at 550 and 650 nm (green and red) and a ketocoumarin as described in U.S. Pat. No. 4,713,312 is used in the blue (450) region.

The foregoing initiators are used in combination with co-initiators and autoxidants. The preferred autoxidants are thiols such as 6-ethoxy-2-mercaptobenzoxaxole, however, they are difficult to encapsulate. Consequently, dialkylanilines are preferred autoxidants such as 2,6-diisopropyl-N,N-dimethylaniline. Other useful autoxidants are described in U.S. Pat. No. 4,576,891.

To match gamma, the pre-exposure or co-exposure will be limited to the wavelengths at which one or two of the three sets of microcapsules is/are sensitive. A "white light" (all wavelengths) pre-exposure or coexposure may also be useful, however, to soften the H&D curves of all the microcapsules and thereby improve tone.

Having described the invention in detail and by reference to preferred embodiments thereof, it will be apparent that modifications and variations are possible without departing from the scope of the appended claims.

What is claimed is:

1. A process for forming full color images using a photosensitive material which includes a support having a layer of photosensitive microcapsules on the surface thereof, said photosensitive microcapsules including a first, a second and a third set of microcapsules uniformly distributed on said surface; said first set of microcapsules containing a cyan image-forming agent and a first photohardenable composition sensitive in a first wavelength band, said second set of microcapsules containing a magenta image-forming agent and a second photohardenable composition sensitive in a second wavelength band, and said third set of microcapsules containing a yellow image-forming agent and a third photohardenable composition sensitive in a third wavelength band; said process comprising the steps of:

uniformly exposing said photosensitive material to radiation within at least one of said first, second, and third wavelength bands in an amount sufficient to sequester oxygen present in said microcapsules and thereby differentially adjust the gamma of at least one of said first, second and third sets of microcapsules such that it more closely approximates the gamma of the other of said microcapsules;

image-wise exposing said photosensitive material to radiation within said first, second and third wavelength bands; and subjecting said microcapsules to a uniform rupturing force to cause said microcapsules to rupture and release image-wise said cyan, magenta and yellow image-forming agents.

2. The process of claim 1 wherein said image-forming agents are color precursors and said step of subjecting said microcapsules to a uniform rupturing force is performed in the presence of a developer material which reacts with said color precursor to form a color image.

3. The process of claim 2 wherein said first, second and thirds bands of radiation are red, green and blue light respectively.

4. The process of claim 1 wherein said step of uniformly exposing said photosensitive material to radiation is performed in an amount sufficient to sequester oxygen present in said microcapsules but insufficient to substantially advance polymerization in said photohardenable composition.

5. The process of claim 1 wherein said photosensitive material is uniformly exposed to radiation in only one of said first, second and third wavelength bands.

6. The process of claim 1 wherein said photosensitive material is uniformly exposed to radiation in only two of said first, second and third wavelength bands.

7. The process of claim 1 wherein said step of uniformly exposing said photosensitive material to radiation is conducted simultaneously with said step of image-wise exposing said photosensitive material to radiation.

8. The process of claim 1 wherein said step of uniformly exposing said photosensitive material to radiation is conducted immediately prior to said step of image-wise exposing said photosensitive material to radiation.

9. The process of claim 1 wherein said photohardenable composition is a free radical addition polymerizable composition.

10. The process of claim 9 wherein said photohardenable composition contains an ethylenically unsaturated compound and an autoxidant.

11. The process of claim 10 wherein said autoxidant is a dialkylaniline or a thiol.

12. The process of claim 1 wherein said photosensitive material is uniformly exposed to light in three of said first, second and third wavelength bands.

* * * * *